United States Patent

Helmstetter et al.

[11] Patent Number: 6,046,913
[45] Date of Patent: Apr. 4, 2000

[54] PANEL MOUNTED POWER MODULE WITH ADAPTOR MOUNTING BRACKET

[75] Inventors: Christopher N. Helmstetter, Bridgewater; Norris B. McLean, Englewood, both of N.J.

[73] Assignee: Lucent Technologies Inc., Murray Hill, N.J.

[21] Appl. No.: 09/066,004

[22] Filed: Apr. 24, 1998

[51] Int. Cl.[7] .............................. H05K 7/14; H01R 9/09
[52] U.S. Cl. .......................... 361/796; 361/752; 361/761; 361/803; 361/724; 361/825; 361/797; 439/630; 439/297
[58] Field of Search ..................... 361/796, 752, 361/761, 803, 724, 727, 753, 797, 825; 439/297, 377, 630, 79

[56] References Cited

U.S. PATENT DOCUMENTS

| | | | |
|---|---|---|---|
| 5,199,878 | 4/1993 | Dewey et al. | 439/49 |
| 5,439,395 | 8/1995 | Laukzemis | 439/668 |
| 5,552,962 | 9/1996 | Feustel et al. | 361/733 |
| 5,839,584 | 11/1998 | Gonsalves et al. | 361/796 |
| 5,966,648 | 10/1999 | Ortberg et al. | 361/752 |
| 5,973,934 | 10/1999 | Roscoe | 361/796 |

*Primary Examiner*—Leo P. Picard
*Assistant Examiner*—Hung Van Duong

[57] ABSTRACT

A power module for mounting in an array of electrical equipment which may have differing sizes, although within any given panel the equipment is all of the same size. The power module contains common circuitry mounted within a housing. Mounting brackets of varying size are secured to the housing to adapt the module for different sized panels.

4 Claims, 5 Drawing Sheets

6,046,913

PANEL MOUNTED POWER MODULE WITH ADAPTOR MOUNTING BRACKET

BACKGROUND OF THE INVENTION

This invention relates to a power module for use with a panel mounting a plurality of pieces of electrical equipment in a parallel adjacent array and, more particularly, to such a module having a bracket which adapts the module for mounting in different sized panels.

Interconnect and cross-connect equipment for telecommunications apparatus is usually mounted in a panel supported on a frame. Such a panel may have slots for holding the equipment in a parallel adjacent array. Often, such equipment requires electrical power for its operation and in such case a power strip is provided. Such a power strip extends along the array and includes a plurality of identical parallel connected connectors located at positions corresponding to the panel slots. The equipment is provided with a complementary connector which mates with a respective connector of the power strip in a plug-in manner when the equipment is mounted to the panel. When there are a number of such panels, a power panel is provided which is mounted to the frame and supplies power to all of the other panels mounted to the frame, and possibly to additional adjacent frames. However, there are applications wherein only one such panel is mounted to a frame and in such an application it is uneconomical to provide a large capacity power panel. It would therefore be desirable to have a power module mountable directly in such a panel for providing power to all of the equipment within that panel.

Differing applications may require such equipment having differing sizes. It would also be desirable to provide a power module of the type described which can be utilized with differently sized equipment.

SUMMARY OF THE INVENTION

The present invention provides a power module for use in combination with a panel mounting a plurality of pieces of electrical equipment in a parallel adjacent array. The panel includes a power strip extending along the array and having a plurality of identical parallel connected first connectors located at positions corresponding to positions of the equipment in the array. Each of the pieces of equipment has a complementary second connector for mating with a respective first connector in a plug-in manner when that piece of equipment is mounted to the panel. There are two different types of panels each for a respective one of two different types of equipment. Each of the two types of equipment and panels have a respective type of first and second connectors and the relative placements of the two types of connectors are different each from the other both in the panel power strip and in the equipment. The power module is adapted to provide power to both types of equipment and is further adapted to be mounted to the panel in a position of the array. The power module comprises a printed circuit board containing power conversion circuitry, a second connector of a first type mounted on the board and connected to the power conversion circuitry and a second connector of a second type mounted on the board and connected to the power conversion circuitry. The second connector of the first type corresponds to the second connector of equipment of the first type and the second connector of the second type corresponds to the second connector of equipment of the second type. The power module further includes a housing containing the printed circuitry board. The housing has a planar rectangular base wall adapted to have the board secured thereto in parallel configuration, a front wall along an edge of the base wall and orthogonal thereto, and a pair of side walls along opposed edges of the base wall and orthogonal to the base wall and to the front wall. The second connectors are exposed at the rear of the housing. A mounting bracket is secured to the housing, leaving the second connectors exposed when the bracket is secured to the housing, the bracket being adapted for mounting the power module to the panel. According to the present invention, when the power module is for use with equipment of the first type, the bracket is of a first size compatible with the size of the equipment of the first type and when the power module is for use with equipment of the second type the bracket is of a second size compatible with the size of the equipment of the second type. The placement of the second connectors on the board and the securing of the bracket to the housing are so related that the appropriate second connector of the power module matingly engages a first connector of the power strip when the power module is installed in the panel in a position of the array.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
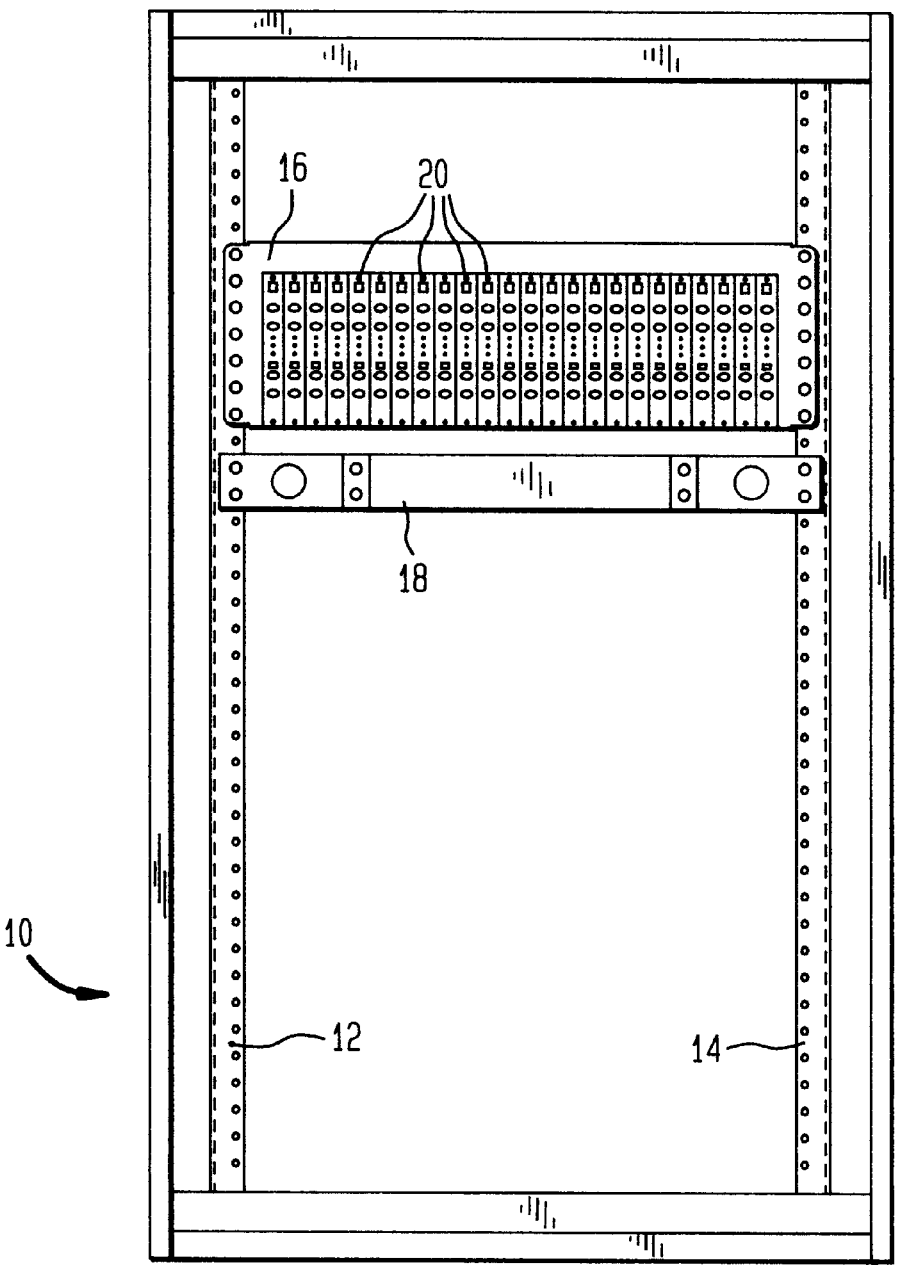
FIG. 1 is a front view of a frame holding an interconnect and cross-connect equipment panel and a power panel, as is known in the prior art.

Referring now to the drawings, FIG. 1 illustrates a prior art frame, designated generally by the reference numeral 10, having a pair of uprights 12, 14 to which are mounted a bracket 16 and a power panel 18. The bracket 16 is provided with twenty four slots each for holding a respective jack panel module 20 illustratively of the type disclosed in U.S. Pat. No. 5,552,962. Although only a single bracket 16 is shown in FIG. 1, the frame 10 is capable of accommodating numerous such brackets 16, the jack panel modules 20 of all of which are powered by the power panel 18.

Figure 2:
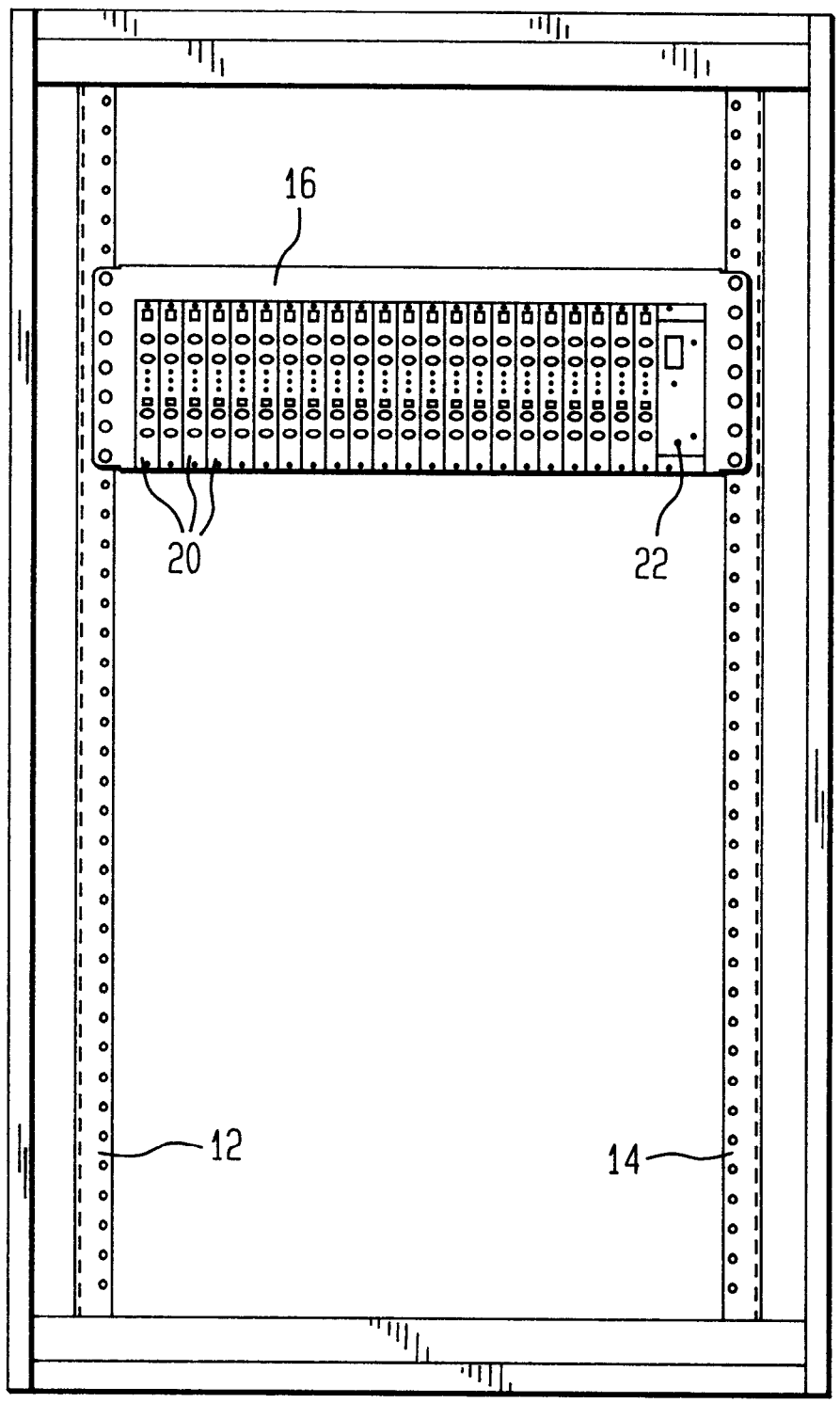
FIG. 2 is a front view similar to FIG. 1 showing a power module according to the present invention occupying two slots of the equipment panel.

As previously discussed, there are applications wherein only a single bracket 16 is mounted to a frame. As shown in FIG. 2, where the single bracket 16 is mounted to the uprights 12, 14, according to the present invention only twenty two of the slots of the bracket 16 are used for the jack panel modules 20, and a power module 22 according to the present invention fills the two remaining slots of the bracket 16.

Figure 3:
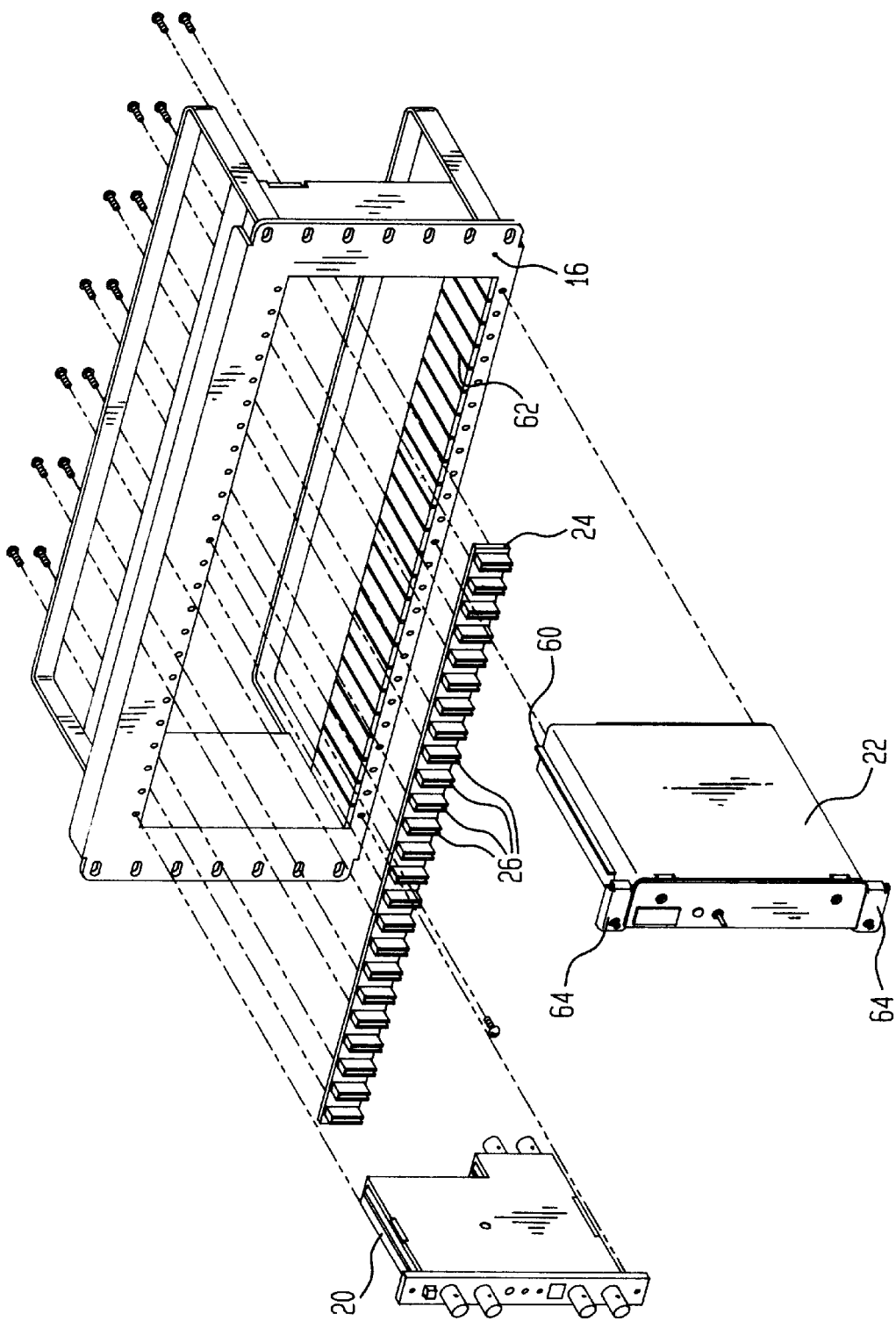
FIG. 3 is an exploded front perspective view of the panel shown in FIG. 2.

FIG. 3 shows the bracket 16 having slots for receiving up to twenty four of the jack panel modules 20 in a parallel adjacent array. A power strip 24 is mounted to the bracket 16 and includes twenty four identical connectors 26. The connectors 26 are connected in parallel and are each aligned with a respective one of the slots of the bracket 16 so that a connector (not shown) at the rear of each of the modules 20 mates with a respective aligned one of the connectors 26 when that jack panel module 20 is fully seated in a slot. As will be described in full detail hereinafter, the power module 22 includes a connector at its rear which matingly engages one of the connectors 26 when the power module 22 is installed in a slot in the bracket 16. Accordingly, the power module 22 provides power to all of the jack panel modules 20 installed in the bracket 16 through the connectors 26 on the power strip 24.

Figure 4:
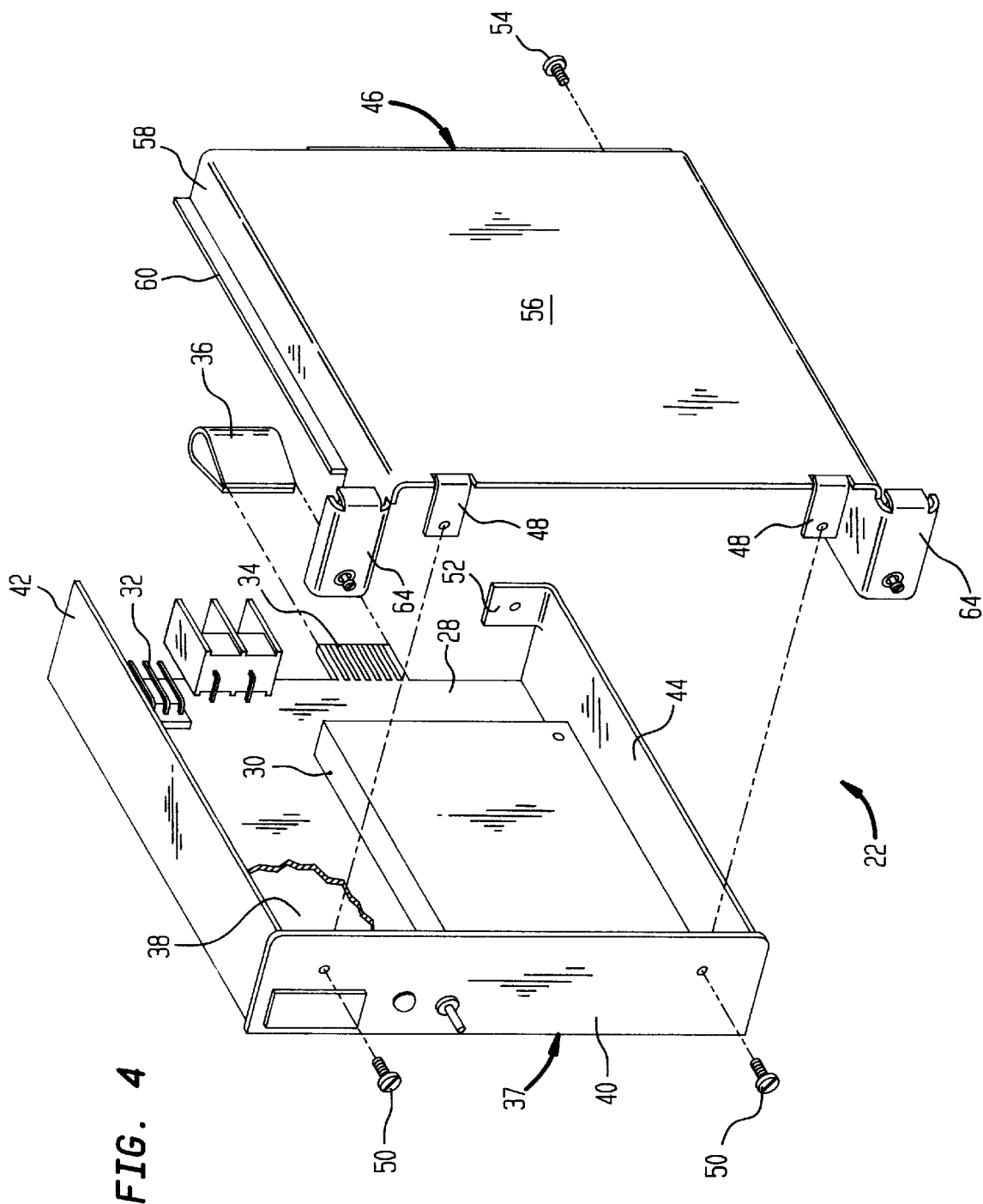
FIG. 4 is an exploded front perspective view showing a power module according to the present invention having a mounting bracket of a first size.

FIG. 4 shows a first embodiment of a power module 22 according to the present invention. The module 22 includes a printed circuit board 28 on which is mounted power conversion circuitry 30. (Although not shown in the drawings, the power module 22 is connected to a source of power for operating the power conversion circuitry 30, as is well known in the art.) A connector 32 is mounted on the printed circuit board 28 and is connected to the power conversion circuitry 30. The connector 32 is at the rear of the module 22 and is of the same type as the power connector at the rear of each jack panel module 20. The connector 32 is at the appropriate relative position in the power module 22 so that when the power module 22 is installed in the bracket 16 the connector 32 matingly engages an aligned one of the connectors 26 on the power strip 24.

As was previously discussed, for different applications the jack panel modules 20 come in different sizes. The difference in size relates mainly to the height of the jack panel modules. Accordingly, the bracket 16 would have correspondingly different dimensions. Further, the power strip would be mounted at a different relative position and would have different connectors thereon. Since it is desired to have as much commonality of components as possible, the power module 22 also includes another connector 34 on the printed circuit board 28 which is also connected to the power conversion circuitry 30. The connector 34 is also exposed at the rear of the power module 22 and is positioned and configured to mate with an appropriate power strip connector for another size jack panel module. When not in use, the connector 34 is protected by a removable cover 36. A cover could also be provided for the connector 32 when it is not in use.

The printed circuit board 28 is mounted in a housing 37 having a planar rectangular base wall 38 to which the printed circuit board 28 is secured in parallel configuration. The housing 37 further includes a front wall 40 along an edge of the base wall 38 and orthogonal thereto, and a pair of side walls 42, 44 along opposed edges of the base wall 38 and orthogonal to the base wall 38 and to the front wall 40. The housing 37 does not have a rear wall, so the connectors 32, 34 are exposed at the rear thereof.

The power module 22 also includes a mounting bracket 46 which is secured to the housing 37. The bracket 46, when secured to the housing 37, leaves the connectors 32, 34 exposed. To secure the bracket 46 to the housing 37, the bracket 46 includes a pair of front tabs 48 which are attached to the front wall 40 by the screws 50 and a rear tab (not shown) which is secured to the wraparound tab 52 of the side wall 44 by the screw 54. The bracket 46 includes a planar wall 56 which is parallel to the base wall 38 and extends between the side walls 42, 44. The bracket 46 further includes an upper wall 58 and a lower wall (not shown) which is the inverse of the upper wall 58. At the end of the upper wall 58 is a locating flange 60 adapted for receipt in one of the slots 62 of the bracket 16 (FIG. 3). The bracket 46 further includes a pair of mounting tabs 64 secured to the planar wall 56 and which extend above and below the side walls 42, 44, respectively, of the power module housing 37 when the mounting bracket 46 is secured thereto. The mounting tabs 64 are for the purpose of securing the power module 22 to the bracket 16. When the mounting bracket 46 is secured to the housing 37, the overall width of the power module 22 is such that the module 22 occupies two slots of the bracket 16. However, only one of the connectors 26 of the power strip 24 is used.

Figure 5:
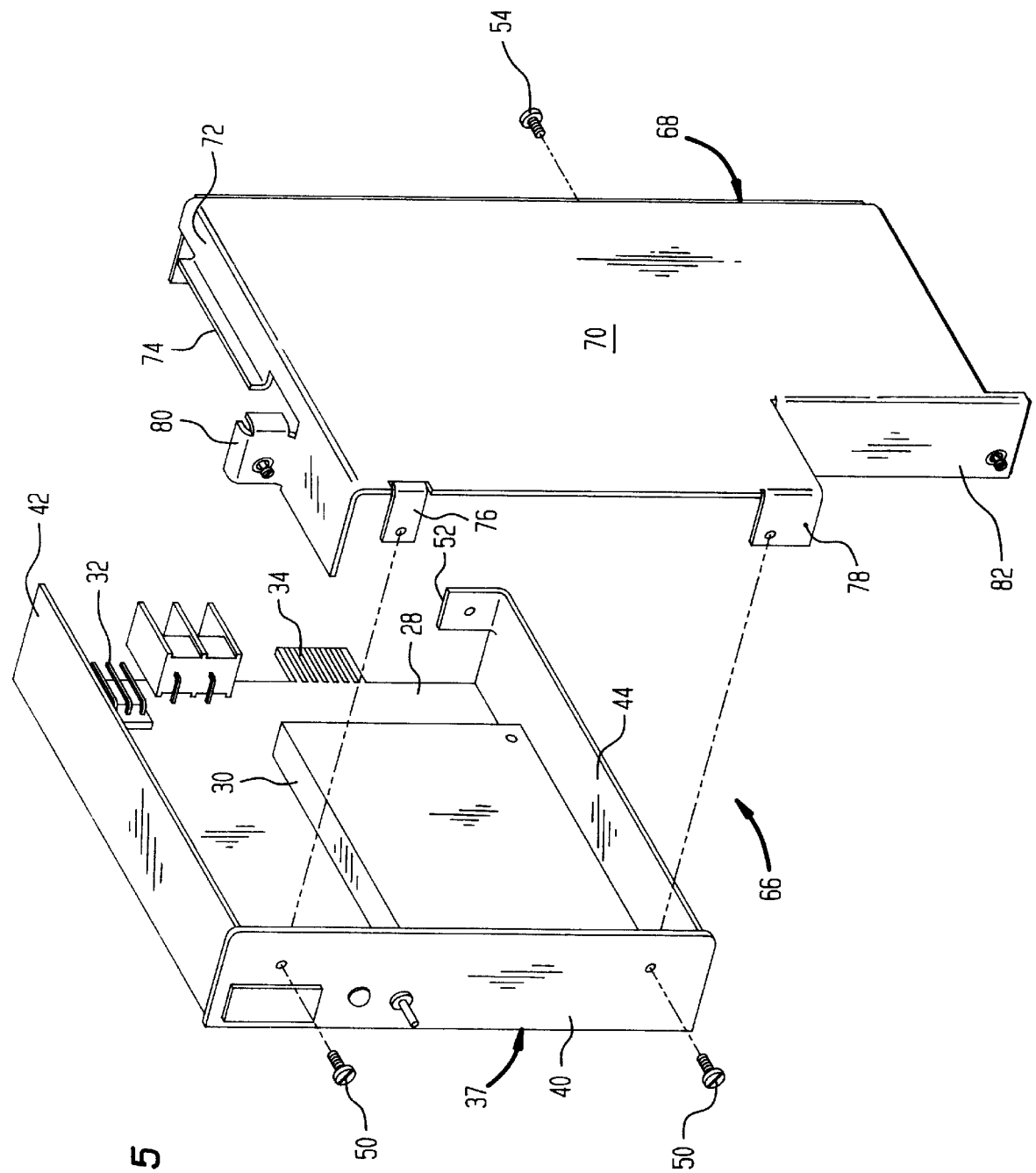
FIG. 5 is an exploded front perspective view of a power module according to the present invention having a mounting bracket of a second size.

FIG. 5 shows a power module 66 which has in common with the power module 22 the printed circuit board 28 and the housing 37, but which has a mounting bracket 68 for use in a panel where the jack panel modules are of a larger size than those previously shown. Thus, the mounting bracket 68 includes a planar wall 70, an upper wall 72 with a locating flange 74 and a lower wall (not shown) with a lower locating flange (not shown). Tabs 76, 78 at the front of the mounting bracket 68 and a tab (not shown) at the rear of the mounting bracket 68 are used to install the mounting bracket 68 on the housing 37 via the screws 50, 54. Since the mounting bracket 68 is adapted for use with a bracket containing a taller jack panel module and since the housing 37 containing the printed circuit board 28 is of a size compatible with the size of the shorter jack panel module, the planar wall 70 extends beyond the side wall 44 of the housing 37 to compensate for the dimensional difference between the housing 37 and the taller jack panel module. Thus, the mounting bracket 68 includes an upper mounting tab 80 adjacent to the upper side wall 42 and a lower mounting tab 82 remote from the lower side wall 44. The mounting tabs 80, 82 are for mounting the power module 66 to an appropriately sized bracket 16. Since the taller jack panel module is not as deep as the shorter jack panel module, the mounting tabs 80, 82 are set back from the front wall 40 to compensate for this difference in dimension.

Accordingly, there has been disclosed an improved power module having a mounting bracket which adapts the module for mounting in different sized equipment panels. While exemplary embodiments of the present invention have been disclosed herein, it will be appreciated by those skilled in the art that various modifications and adaptations to the disclosed embodiments may be made and it is intended that this invention be limited only by the scope of the appended claims.

What is claimed is:

1. A power module for use in combination with a panel mounting a plurality of pieces of electrical equipment in a parallel adjacent array, the panel including a power strip extending along the array and having a plurality of identical parallel connected first connectors located at positions corresponding to positions of said equipment in said array, each of the pieces of equipment having a complementary second connector for mating with a respective first connector in a plug-in manner when said each piece of equipment is mounted to the panel, wherein there are two different types of panels each for a respective one of two different types of panels and equipment, each of the two types of equipment having a respective type of first and second connector, and wherein the relative placements of the two types of connectors are different each from the other both in the panel power strip and in the equipment, the power module being adapted to provide power to both types of equipment and being further adapted to be mounted to the panel in a position of the array, the power module comprising:

a printed circuit board containing power conversion circuitry;

a second connector of a first type mounted on the board and connected to the power conversion circuitry, wherein the second connector of a first type corresponds to the second connector of equipment of a first type;

a second connector of a second type mounted on the board and connected to the power conversion circuitry, wherein the second connector of a second type corresponds to the second connector of equipment of a second type;

a housing containing said printed circuit board, said housing having a planar rectangular base wall adapted to have said board secured thereto in parallel configuration, a front wall along an edge of said base wall and orthogonal thereto, and a pair of side walls along opposed edges of said base wall and orthogonal to said base wall and to said front wall, wherein said second connectors are exposed at the rear of said housing; and a mounting bracket secured to said housing, said bracket leaving said second connectors exposed when said bracket is secured to said housing, said bracket being adapted for mounting the power module to the panel;

wherein when said power module is for use with equipment of the first type, the bracket is of a first size compatible with the size of the equipment of the first type, and when said power module is for use with equipment of the second type, the bracket is of a second size compatible with the size of the equipment of the second type, and wherein the placement of the second connectors on the board and the securing of the bracket to the housing are so related that the appropriate second connector of the power module matingly engages a first connector of the power strip when the power module is installed in the panel in a position of the array.

2. The power module according to claim 1 further comprising:

a cover member adapted to cover an unused second connector on the power module board.

3. The power module according to claim 1 wherein said bracket includes:

a planar wall parallel to said housing base wall and extending between said pair of housing side walls; and a pair of mounting tabs secured to said planar wall and on opposite sides of said pair of housing side walls, said pair of mounting tabs adapted to be secured to said panel.

4. The power module according to claim 3 wherein:

said housing has a dimension between said pair of side walls which is substantially the same as the height of the shorter of the two types of equipment; and the planar wall of the bracket which is compatible with the taller of the two types of equipment extends beyond one side wall of the housing to compensate for the dimensional difference between the housing and the taller type of equipment.

* * * * *